(12) United States Patent
Balamurugan et al.

(10) Patent No.: US 11,137,283 B2
(45) Date of Patent: Oct. 5, 2021

(54) PHOTONIC APPARATUS WITH BIAS CONTROL TO PROVIDE SUBSTANTIALLY CONSTANT RESPONSIVITY OF A PHOTODETECTOR

(71) Applicant: Intel Corporation, Santa Clara, CA (US)

(72) Inventors: Ganesh Balamurugan, Hillsboro, OR (US); Haisheng Rong, Pleasanton, CA (US); Meer Nazmus Sakib, Berkeley, CA (US); Hao Li, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 231 days.

(21) Appl. No.: 16/402,990

(22) Filed: May 3, 2019

(65) Prior Publication Data

US 2019/0257688 A1 Aug. 22, 2019

(51) Int. Cl.
| | |
|---|---|
| *G01J 1/44* | (2006.01) |
| *G01J 1/16* | (2006.01) |
| *G01J 1/42* | (2006.01) |
| *H01L 31/0203* | (2014.01) |
| *G02B 6/12* | (2006.01) |

(Continued)

(52) U.S. Cl.
CPC ............ *G01J 1/1626* (2013.01); *G01J 1/0228* (2013.01); *G01J 1/0252* (2013.01); *G01J 1/0295* (2013.01); *G01J 1/4228* (2013.01); *G01J 1/44* (2013.01); *G01J 3/26* (2013.01); *G02B 6/12* (2013.01);

(Continued)

(58) Field of Classification Search
CPC .. H04N 5/361; H04N 5/2176; H04N 5/36963; G01J 2001/444; G01J 1/1626; G01J 1/0295; G01J 1/4228
See application file for complete search history.

(56) References Cited

U.S. PATENT DOCUMENTS

2017/0031009 A1* 2/2017 Davidovic ............ G01S 7/4865
2017/0207600 A1* 7/2017 Klamkin ................. H01S 5/142

OTHER PUBLICATIONS

Meer Sakib et al., "Demonstration of a 50 Gb/s all-silicon waveguide photodetector for photonic integration," Conference on Lasers and Electro-Optics, OSA Technical Digest, May 2018, 5 pages.

(Continued)

*Primary Examiner* — Thanh Luu
(74) *Attorney, Agent, or Firm* — Schwabe, Williamson & Wyatt, P.C.

(57) ABSTRACT

Embodiments of the present disclosure are directed toward techniques and configurations for a photonic apparatus with a photodetector with bias control to provide substantially constant responsivity. The apparatus includes a first photodetector, to receive an optical input and provide a corresponding electrical output; a second photodetector coupled with the first photodetector, wherein the second photodetector is free from receipt of the optical input; and circuitry coupled with the first and second photodetectors, to generate a bias voltage, based at least in part on a dark current generated by the second photodetector in an absence of the optical input, and provide the generated bias voltage to the first photodetector. The first photodetector is to provide a substantially constant ratio of the electrical output to optical input in response to the provision of the generated bias voltage. Additional embodiments may be described and claimed.

16 Claims, 11 Drawing Sheets

(51) Int. Cl.
    *G01J 1/02*    (2006.01)
    *G01J 3/26*    (2006.01)
(52) U.S. Cl.
    CPC .................. *H01L 31/0203* (2013.01); *G02B 2006/12061* (2013.01)

(56) References Cited

OTHER PUBLICATIONS

C. Sun et al., "A Monolithically-Integrated Chip-to-Chip Optical Link in Bulk CMOS," IEEE Journal of Solid-State Circuits, vol. 50, No. 4, (2014) pp. 828-844.

Jim Williams et al., "Bias Voltage and Current Sense Circuits for Avalanche Photodiodes," Conference on Lasers and Electro-Optics, OSA Technical Digest, May 2018, 5 pages.

O'Connell et al., "Automatic Gain and Bias Control of Avalanche Photodiodes," CIEEE LEOS Annual Meeting Conference Proceedings, (2005), 2 pages.

\* cited by examiner

PHOTONIC APPARATUS WITH BIAS CONTROL TO PROVIDE SUBSTANTIALLY CONSTANT RESPONSIVITY OF A PHOTODETECTOR

FIELD

Embodiments of the present disclosure generally relate to the field of optoelectronics, and more particularly, to techniques and configurations for bias control of silicon waveguide photodetectors in integrated photonic devices.

BACKGROUND

Silicon waveguide based photodetectors (SiPDs) have emerged as a low-cost alternative to III-V or Germanium-based solutions on integrated silicon photonic devices (chips) for high-speed optical interconnect applications.

However, there are some challenges for this type of photodetector. The photodetector's responsivity (e.g., ratio of its output photocurrent to input optical power) depends on the bias voltage of the photonic device, temperature, and the input optical power. These sensitivities, if uncompensated, can result in severe signal distortion and loss of information.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
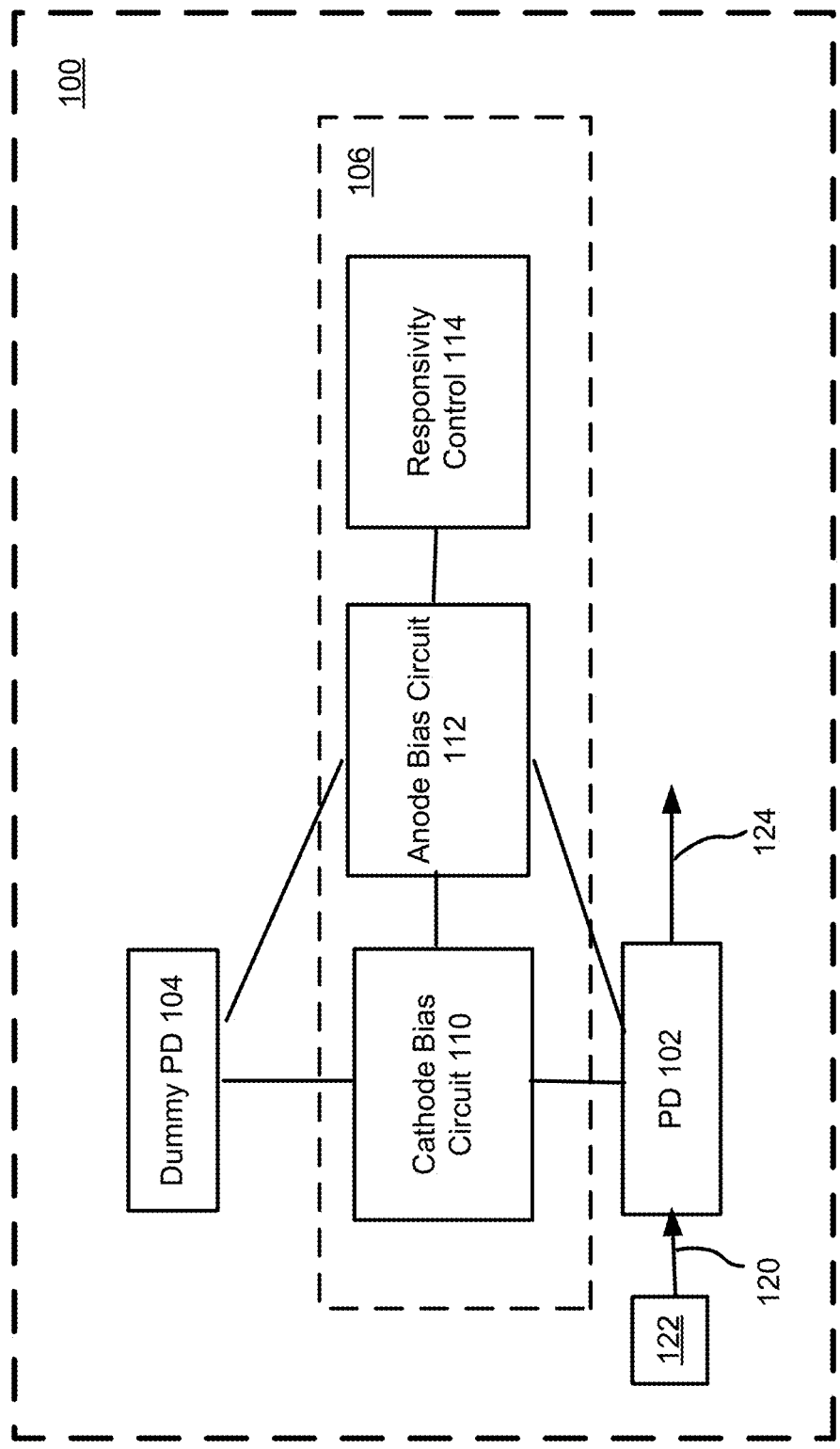
FIG. 1 is an example block diagram of a photonic apparatus having a photodetector with bias control to provide substantially constant responsivity, in accordance with some embodiments.

Embodiments of the present disclosure describe techniques and configurations for a photonic apparatus with a photodetector with bias control to provide substantially constant responsivity. The apparatus includes a first photodetector, to receive an optical input and provide a corresponding electrical output, and a second photodetector coupled with the first photodetector. The second photodetector is free from receipt of the optical input. The apparatus further includes circuitry coupled with the first and second photodetectors, to generate a bias voltage, based at least in part on a dark current generated by the second photodetector in the absence of an optical input, and provide the generated bias voltage to the first photodetector. The first photodetector is to provide a substantially constant ratio of the electrical output to optical input in response to the provision of the generated bias voltage.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIG. 1 is an example block diagram of a photonic apparatus having a photodetector with bias control to provide substantially constant responsivity, in accordance with some embodiments. In embodiments, the apparatus 100 comprises a photonic integrated circuit (PIC) and/or electronic IC (EIC) and may function, for example, as an optical transceiver that can be used in computers and servers with high-speed optical input/output (I/O), pluggable Ethernet® modules in data centers, fiber networks and telecommunications, or other applications.

In embodiments, the apparatus 100 includes a photodetector (PD) 102, for example, a silicon waveguide based PD (SiPD). As shown, the PD 102 receives optical input (e.g., optical data signal 120) from an optical data source 122, e.g., a laser, modulator, demultiplexer, optical cable, or the like, and provides electrical output 124 (e.g., electrical data signal).

In embodiments, the apparatus 100 further includes a "dummy" PD 104 coupled with the PD 102, as shown. The "dummy" PD 104 is configured with parameters similar (e.g., substantially identical) to those of the PD 102. In other words, the "dummy" PD 104 and signal PD 102 are designed to have identical dimensions, layout, doping, orientation, and the like to improve matching between their characteristics. In contrast to the PD 102, in operation, "dummy" PD 104 does not get illuminated, e.g., no optical input or incident light is provided to the "dummy" PD 104. The "dummy" PD 104, with absence of optical input and/or incident light, is provided in the apparatus 100 for the following reasons.

To obtain adequate responsivity (e.g., greater than 0.4 Ampere/Watt (A/W)), the SiPD needs to be biased at a voltage greater than about 5.85V. As the bias voltage approaches breakdown (e.g., approximately 6V), the photodetector responsivity (e.g., ratio of its output photocurrent to input optical power) is increasingly more sensitive to the bias voltage and input optical power.

Figure 2:
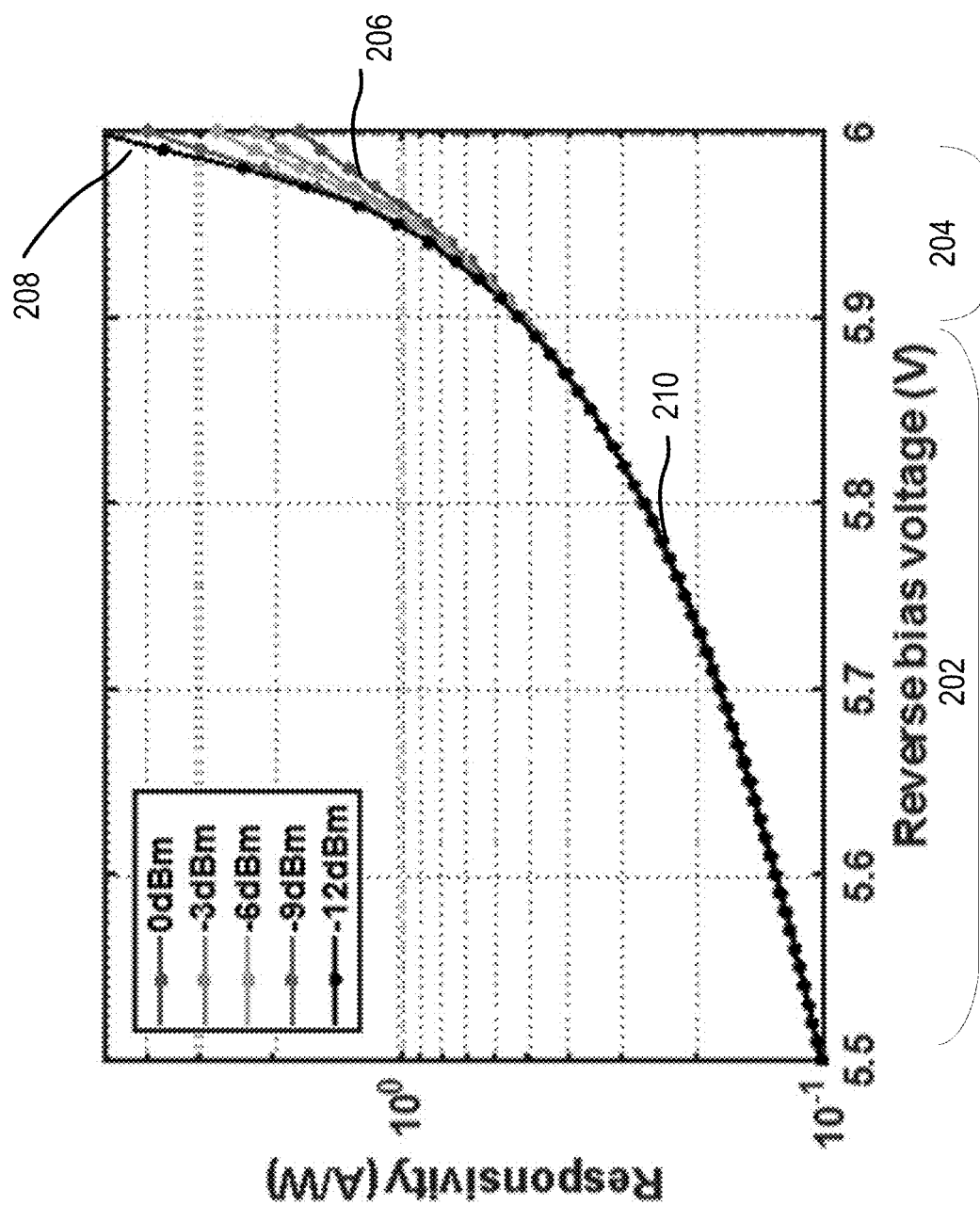
FIG. 2 illustrates an example graph showing a dependency of the SiPD's responsivity on the bias voltage, at various optical input powers, in accordance with some embodiments.

FIG. 2 illustrates an example graph showing a dependency of the SiPD's responsivity on the bias voltage, at various optical input powers, in accordance with some embodiments. As shown, the graph portion 204 becomes non-linear above a certain bias threshold, compared to the graph portion 202. In other words, in the graph portion 204, the responsivity begin to vary depending on the input power (compare, e.g., curves 206 and 208 for different input power levels), whereas in the graph portion 202, the responsivity remains substantially the same for different power levels (see e.g., curve 210).

Figure 3:
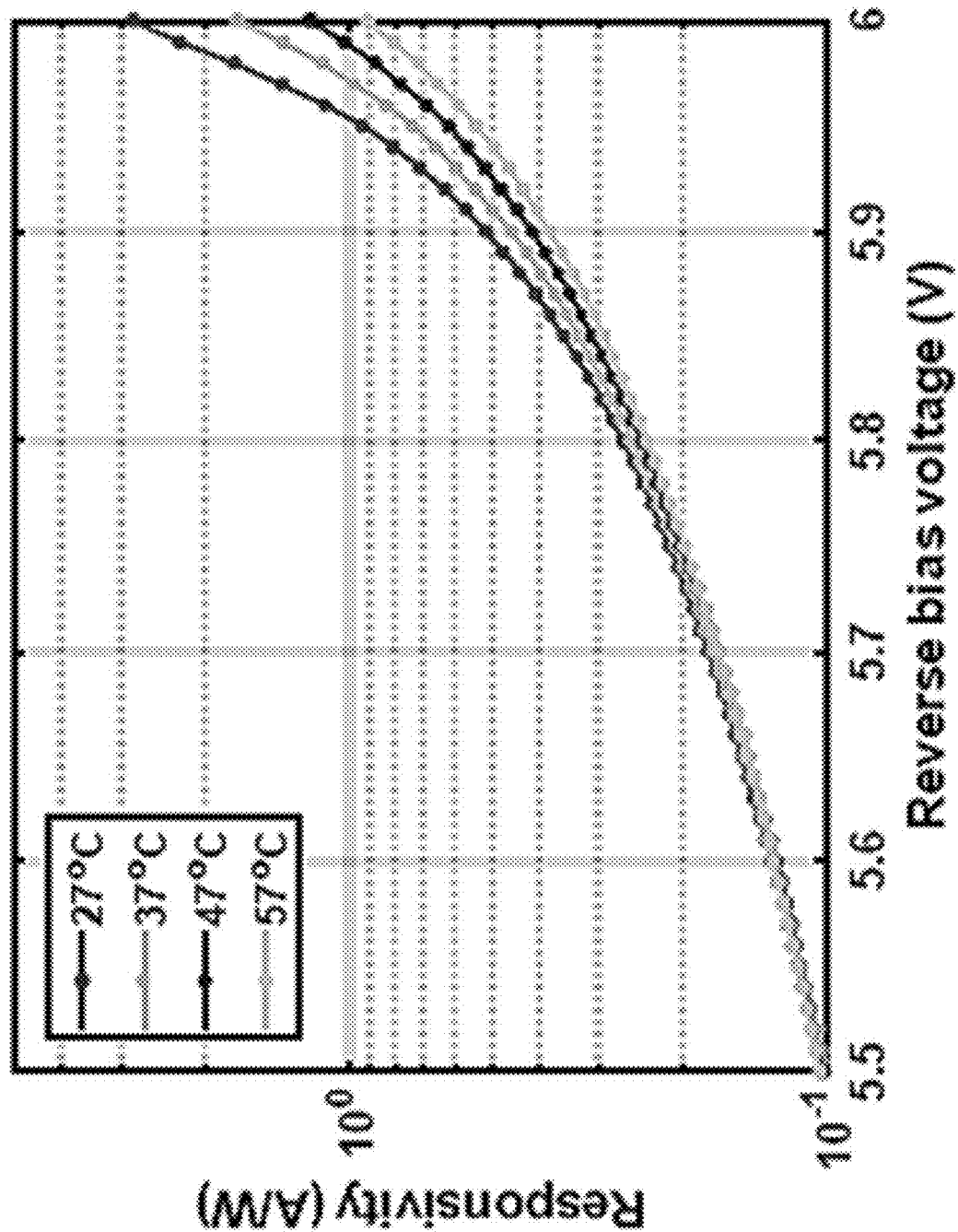
FIG. 3 is an example graph showing a dependency of the SiPD's responsivity on the bias voltage at different temperatures, in accordance with some embodiments.

FIG. 3 illustrates an example graph showing a dependency of the SiPD's responsivity on the bias voltage at different temperatures, in accordance with some embodiments. As shown, the SiPD's responsivity versus bias voltage curve shifts with temperature. Accordingly, the bias voltage also needs to be adjusted to maintain a substantially constant responsivity (ratio of the optical input power to electrical output current) for stable operation of the photonic device. Variation of responsivity with input power levels leads to signal distortion so that the electrical output from the PD is not a replica of the optical input.

The embodiments described herein provide for avoiding the nonlinearity in the graph portion 204 (FIG. 2), and keeping the responsivity substantially constant, for different input power levels. This is accomplished by biasing farther from breakdown (e.g., below 5.9V, as shown in graph portion 202), where the curves shown in FIG. 2 (e.g., 206 and 208) substantially overlap. Therefore, the controlled SiPD bias according to the embodiments described herein provides for stabilization of the SiPD characteristics (e.g., responsivity) in the photonic device in the presence of temperature fluctuations.

Figure 4:
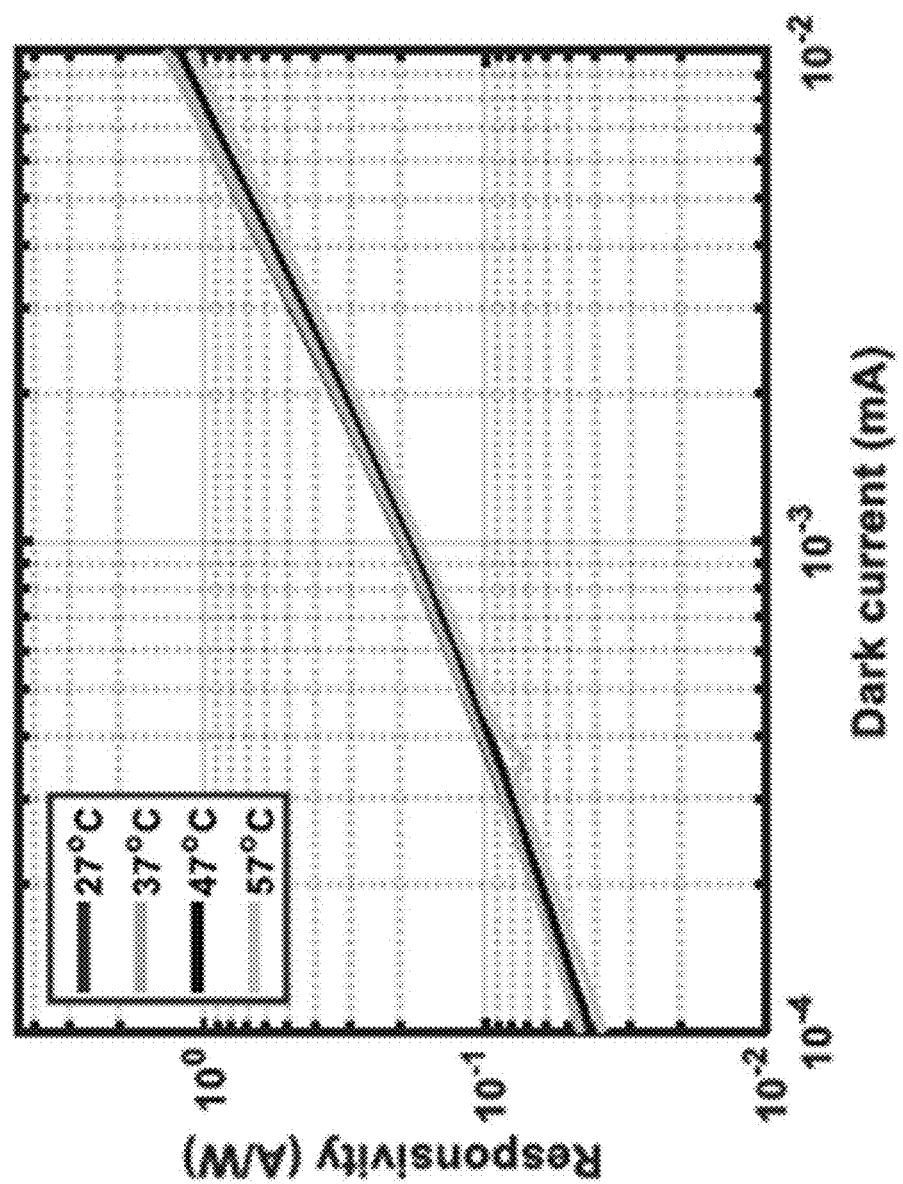
FIG. 4 is an example graph illustrating the SiPD's responsivity as a function of dark current at different temperatures, in accordance with some embodiments.

FIG. 4 illustrates an example graph illustrating the SiPD's responsivity as a function of dark current at different temperatures, in accordance with some embodiments. (The dark current comprises a residual electric current flowing in a photoelectric device when there is no incident illumination.) As shown in FIG. 4, responsivity and dark current are strongly correlated with respect to temperature changes. Further, responsivity and dark current are strongly correlated with respect to bias voltage changes. According to the embodiments described herein, the dark current from an identical but unilluminated "dummy" SiPD (PD 104) next to the signal SiPD (PD 102) is used as an indicator and control of its responsivity.

As shown in FIG. 1, the apparatus 100 further includes circuitry 106 coupled with PD 102 and "dummy" PD 104. The circuitry 106 is configured to monitor the dark current at the "dummy" PD 104. The circuitry 106 is further configured to monitor the bias of the "dummy" PD 104, and adjust it to a desired value, which corresponds to desired PD 102 responsivity. The circuitry 106 is further configured to replicate the "dummy" PD 104's bias voltage to bias the signal PD 102. Accordingly, the PD 102's responsivity can be maintained at substantially constant (e.g., at a preset value) by controlling its bias voltage to compensate its temperature dependence. Since the optical power received by the PD 102 is unknown a priori, the circuitry 106 is further configured to provide an optical automatic gain control (OAGC), using the bias-dependent responsivity of the SiPD. The term "substantially constant" used herein means that the deviation from the constant (preset) value of the ratio of the optical input power to electrical output current or voltage may not exceed about 2%-5%.

As shown in FIG. 1, the circuitry 106 includes an anode bias circuit 112 coupled with the PD 102 and "dummy" PD 104, and configured to control the anode voltage of the "dummy" PD 104. The circuitry 106 further includes a cathode bias circuit 110 coupled with the PD 102, "dummy" PD 104, and anode bias circuit 112, and configured to control the cathode bias voltage of the PD 102, based at least in part on the anode voltage of the "dummy" PD 104. The circuitry 106 further includes a responsivity control circuit 114 coupled with the anode bias circuit 112, and configured to alleviate the input power dependent responsivity of the PD 102, by adjusting the dark current of the "dummy" PD 104 to set the PD 102 responsivity to remain substantially constant. Specifically, the responsivity control circuit 114 is configured to provide OAGC, using the bias-dependent responsivity of the SiPD, to avoid input power dependent non-linear response of the PD 102. The example embodiments of the cathode bias circuit 110, anode bias circuit 110, and responsivity control circuit 114 are described in reference to FIGS. 6-9.

Figure 5:
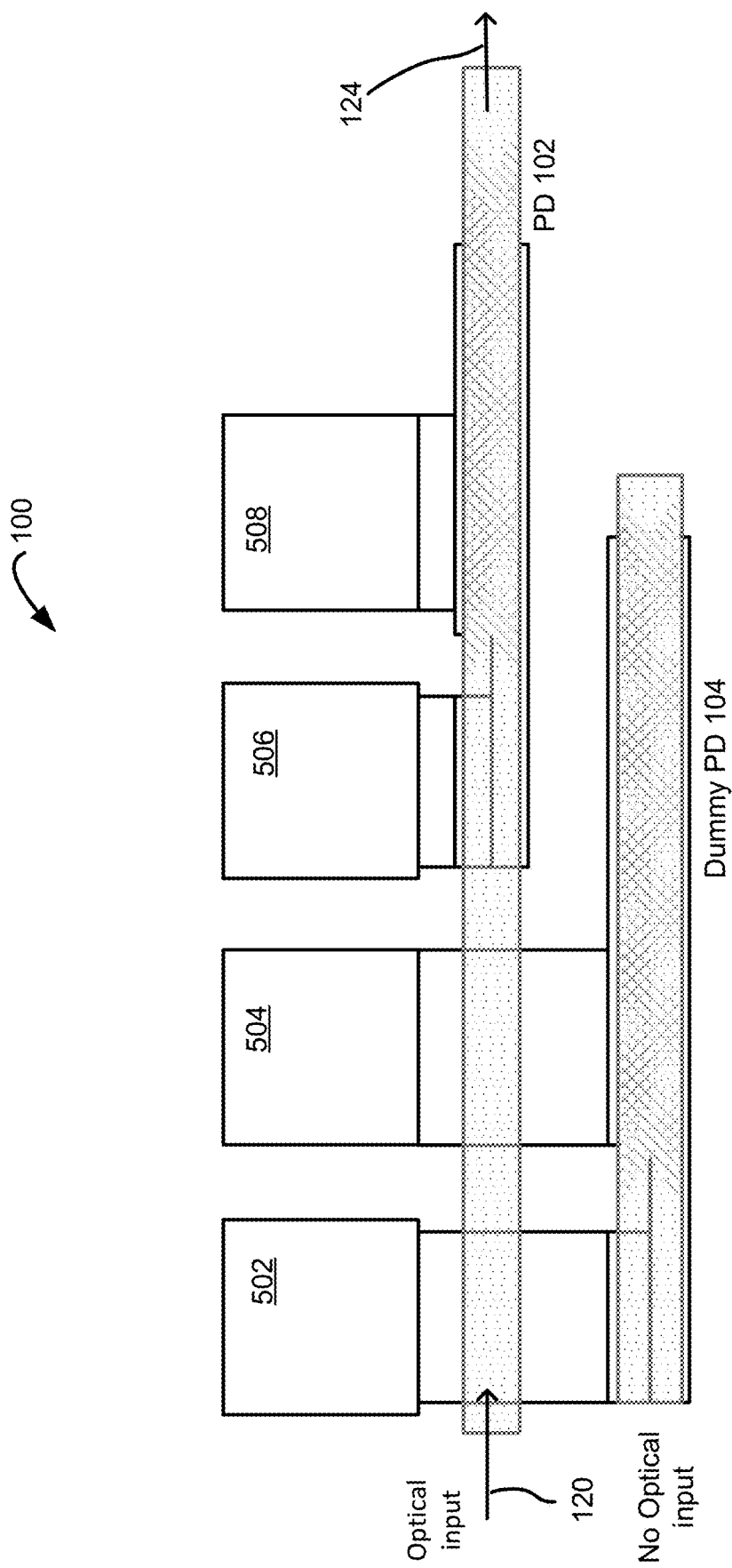
FIG. 5 is an example configuration aspect of the apparatus of FIG. 1, in accordance with some embodiments.

FIG. 5 is an example configuration aspect of the apparatus of FIG. 1, in accordance with some embodiments. More specifically, FIG. 5 illustrates a layout of a portion of the photonic IC (PIC) in apparatus 100. For ease of explanation, like components of FIGS. 1 and 5 are indicated by like numerals. As shown, the apparatus 100 includes the PD 102 and "dummy" PD 104. As discussed above, the "dummy" PD 104 is free from optical input (e.g., optical data signal or incident light). Optical input 120 (e.g., optical data signal) is provided to the PD 102, and in response PD 102 generates electrical output 124 (e.g., electrical data signal). As discussed, PD 102 and "dummy" PD 104 are designed to have substantially identical characteristics. The apparatus 100 further includes electrical contacts (pads) 502 and 504 coupled with the PD 104, and electrical contacts (pads) 506 and 508 coupled with the PD 102, respectively, to provide electrical connections for the cathodes and anodes of PD 102 and "dummy" PD 104. In FIG. 5, PD 102 and "dummy" PD 104 are implemented as doped sections of silicon optical waveguides in a silicon photonic IC. Their layouts are maximally matched to ensure close to identical characteristics e.g., dark current, temperature sensitivity.

Figure 6:
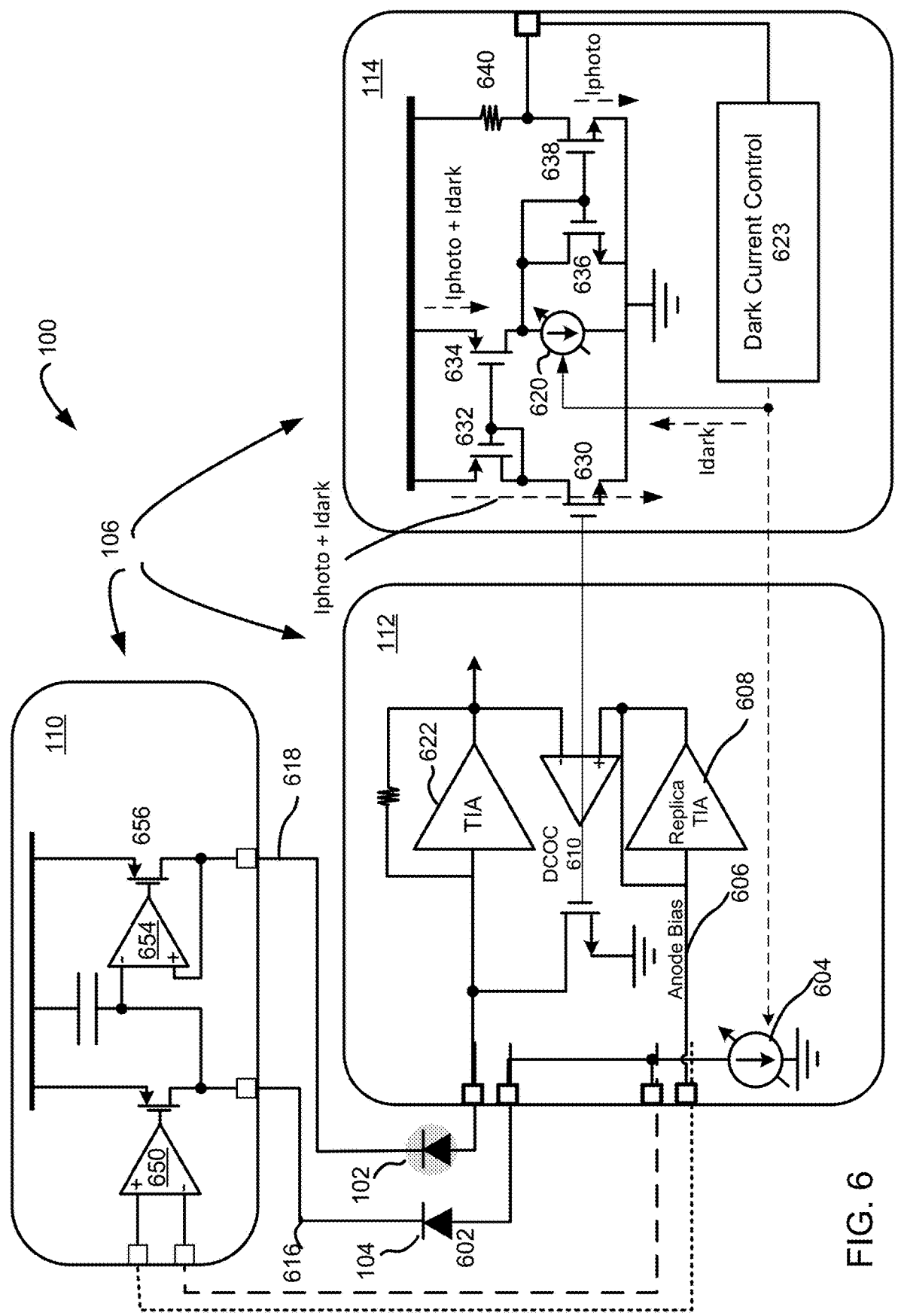
FIG. 6 is an example block diagram of a photonic apparatus of FIG. 1 with bias control circuitry to provide substantially constant responsivity, in accordance with some embodiments.

FIG. 6 is an example block diagram of a photonic apparatus of FIG. 1 with bias control circuitry to provide substantially constant responsivity, in accordance with some embodiments. For ease of explanation, like components of FIGS. 1 and 6 are indicated by like numerals. As shown, FIG. 6 illustrates circuitry 106 comprising an anode bias circuit 112, coupled with the PD 102 and "dummy" PD 104; a cathode bias circuit 110, coupled with the PD 102, "dummy" PD 104, and anode bias circuit 112; and a responsivity control circuit 114, coupled with the anode bias circuit 112, in some detail.

As shown, the primary receiver (signal SiPD) PD 102 is coupled with a nominally identical (but unilluminated) "dummy" PD 104 for monitoring the dark current. The anode 602 of the "dummy" PD 104 is connected to a reference current source 604. The current value of the reference current source 604 is set to a pre-determined dark current value, which corresponds to the desired responsivity of the PD 102. The anode voltage 606 of the "dummy" PD 104 is compared against a replica transimpedance amplifier (TIA) 608 to determine its appropriate cathode bias voltage. The "dummy" PD 104's cathode bias voltage 616 is then replicated to bias the receiver PD 102 (node 618).

The replica TIA 608 is used to generate the desired nominal voltage at anodes of PD 102, 104. The cathode bias of the "dummy" PD 104 is set by a feedback circuit to be the voltage required to support the desired dark current when its anode voltage equals the reference (606) provided by the replica TIA 608. The anode of the "dummy" PD 104 is similarly biased through the DC offset cancellation circuit (DCOC) 610, which subtracts the DC/average current from the output of PD 102. Since the cathode voltage of the "dummy" PD 104 is replicated to the cathode of the signal PD 102, the various bias feedback loops described ensure that the two PDs 102, 104 have identical cathode/anode bias voltages (and hence identical dark currents). Amplifier 650 and the subsequent PMOS device set the cathode bias of the "dummy" PD 104 to the value required to support the reference dark current (604) with an anode voltage equal to that set by the replica TIA (606, 608). This cathode bias (616) serves as a reference to the regulator (654 and 656) that sets the cathode bias on node 618 of the primary/signal PD 102 to the same cathode bias as the "dummy" PD 104. The anode bias of PD 102 is nominally identical to that of the replica TIA 608 because the DC current is diverted from the TIA 622 by the DCOC 610. The cathode bias circuit 110 matches the cathode and anode bias voltages of the two PDs 102 and 104, and hence their dark currents.

In order to alleviate the input power dependent responsivity (nonlinearity) of the PD 102, the circuitry 106 is configured to reduce the PD 102 bias at higher input power levels. This can be accomplished by adjusting the desired dark current value to set the PD 102 responsivity. The responsivity control circuit 114 is configured to implement such an optical automatic gain control. By subtracting the dark current Idark (monitored by the "dummy" PD 104) from the total average (dark and photo) current Iphoto+Idark in the primary receiver PD 102 (monitored via the DCOC 610 of the TIA 622), the received photocurrent Iphoto can be extracted. The current source 620 is a replica of the desired dark current, and is therefore identical to 604.

In the responsivity control circuit 114, transistor 630 mirrors the DCOC current (generated from output of DCOC 610), which is the sum of the photocurrent (from received optical signal) and the dark current. PMOS transistors 632 and 634 mirror the output of transistor 630 to facilitate the subtraction of dark current through the current source 620 (which is set to mirror the desired dark current value). The remaining current (e.g., photocurrent Iphoto) is mirrored by transistors 636 and 638 and flows into a resistor 640 to generate a voltage proportional to the photocurrent. This voltage value is compared against the desired value and used to adjust the desired dark current value (and hence responsivity) as described below.

The dark current control logic 623 is used to set the desired dark current (and hence responsivity), based on the received optical signal. (An example embodiment of the dark current control logic 623 is described in reference to FIG. 9.) This in turn can be used to tune the desired responsivity via the reference dark current value. For example, when the input power exceeds a certain level, the cathode bias voltage on node 618 can be automatically lowered by lowering the reference dark current so that the PD 102 responsivity can be reduced and the PD 102 may not operate in the nonlinear regime. This mitigates the effect of SiPD nonlinearity and allows the PD 102 to tolerate a wide range of input optical powers. For example, the optical receiver (PD 102) needs to tolerate 10-20X range in input optical power.

Figure 7:
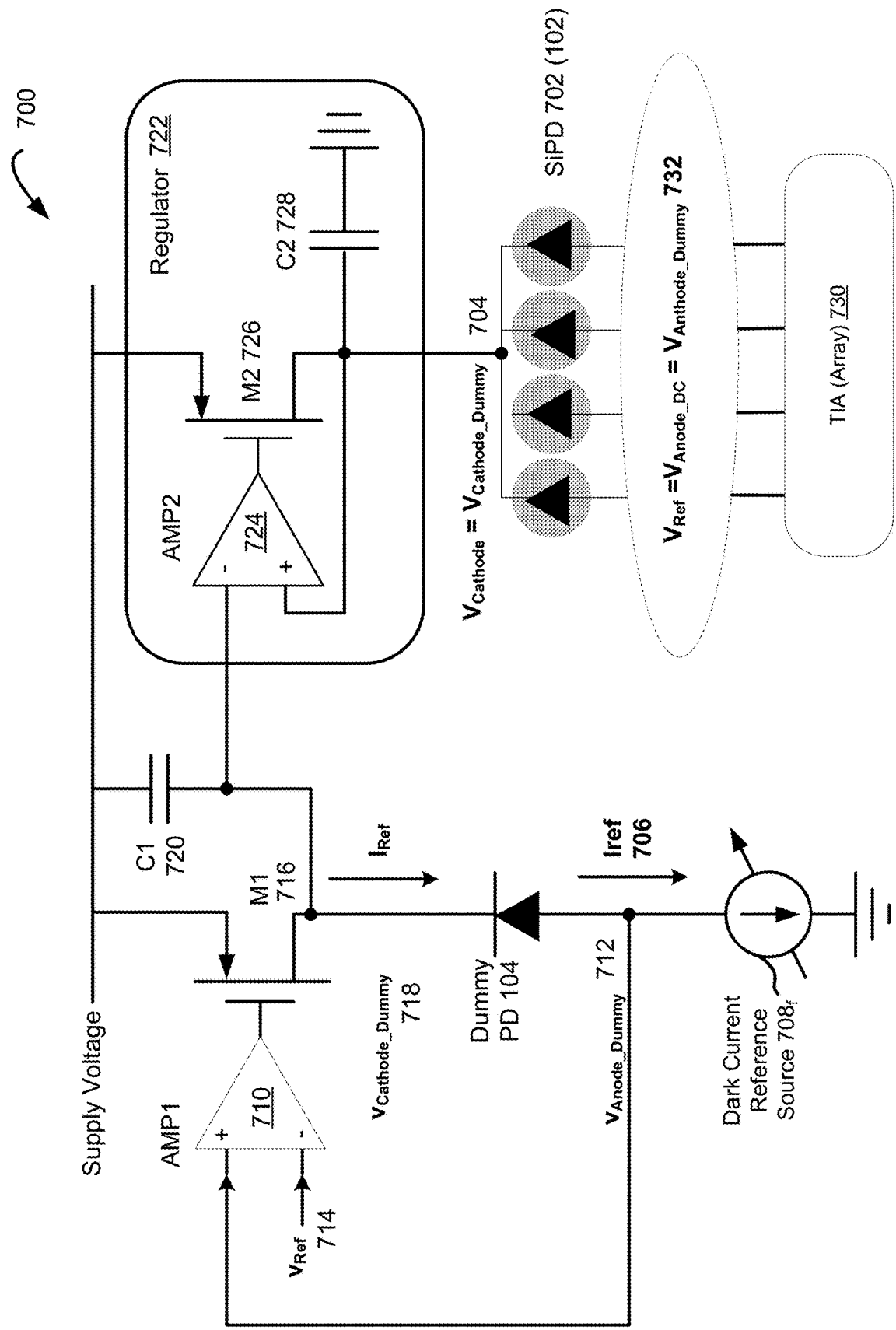
FIG. 7 is an example schematic diagram of an aspect of the photodetector bias circuitry to be used in a photonic apparatus, in accordance with some embodiments.

FIG. 7 is an example schematic diagram of an aspect of the PD bias circuitry to be used in a photonic apparatus, in accordance with some embodiments. More specifically, the bias circuit 700 shown in FIG. 7 incorporates and illustrates in greater detail the cathode bias circuit 110 and at least portions of the anode bias circuit 112 as described in reference to FIG. 6. For ease of explanation, like components of FIGS. 1, 6, and 7 are indicated by like numerals.

The function of the bias circuit 700 is to generate the cathode bias voltage VCathode 704 for the SiPD (e.g. PD 102 of FIGS. 1 and 6). The described embodiments of the bias circuit 700 can support a single channel PD (e.g., 102) or an array of SiPD 702.

A dark current reference Iref 706 is used to set the dark current level of the "dummy" PD 104. The dark current reference current source 708 can be implemented as a digitally-controlled current digital to analog controller (DAC) or analog current source based on the resolution requirement.

An amplifier AMP1 710 compares the voltage difference between the anode of "dummy" PD 104 (VAnode_Dummy 712) with a reference voltage VRef 714. (The method of generating VRef is explained below in reference to FIG. 9.) A transistor M1 716 regulates the cathode voltage of the "dummy" PD 104 (VCathode_Dummy 718) such that the current flowing through "dummy" PD 104 equals Iref. Capacitor C1 720 can be included at the cathode of "dummy" PD 104 to meet the feedback stability requirement.

In embodiments, a voltage regulator 722 includes AMP2 724, transistor M2 726, and capacitor C2 728. The components 724, 726, and 728 are configured to bias the cathode of a single PD 102 or an array of SiPD 702 such that VCathode 704 equals VCathode_Dummy. The design of the voltage regulator 722 is not limited to the specific type shown in the figure.

In order to have identical voltage drop across the "dummy" PD 104 and SiPD 702, the anode reference voltage VRef 732 need to be made substantially identical with the average anode voltage of SiPD (VAnode_DC). To meet this requirement, in embodiments, the bias circuit 700 includes a replica TIA (e.g., 608 in FIG. 6) or TIA array 730 to generate the anode bias reference VRef 732.

Figure 8:
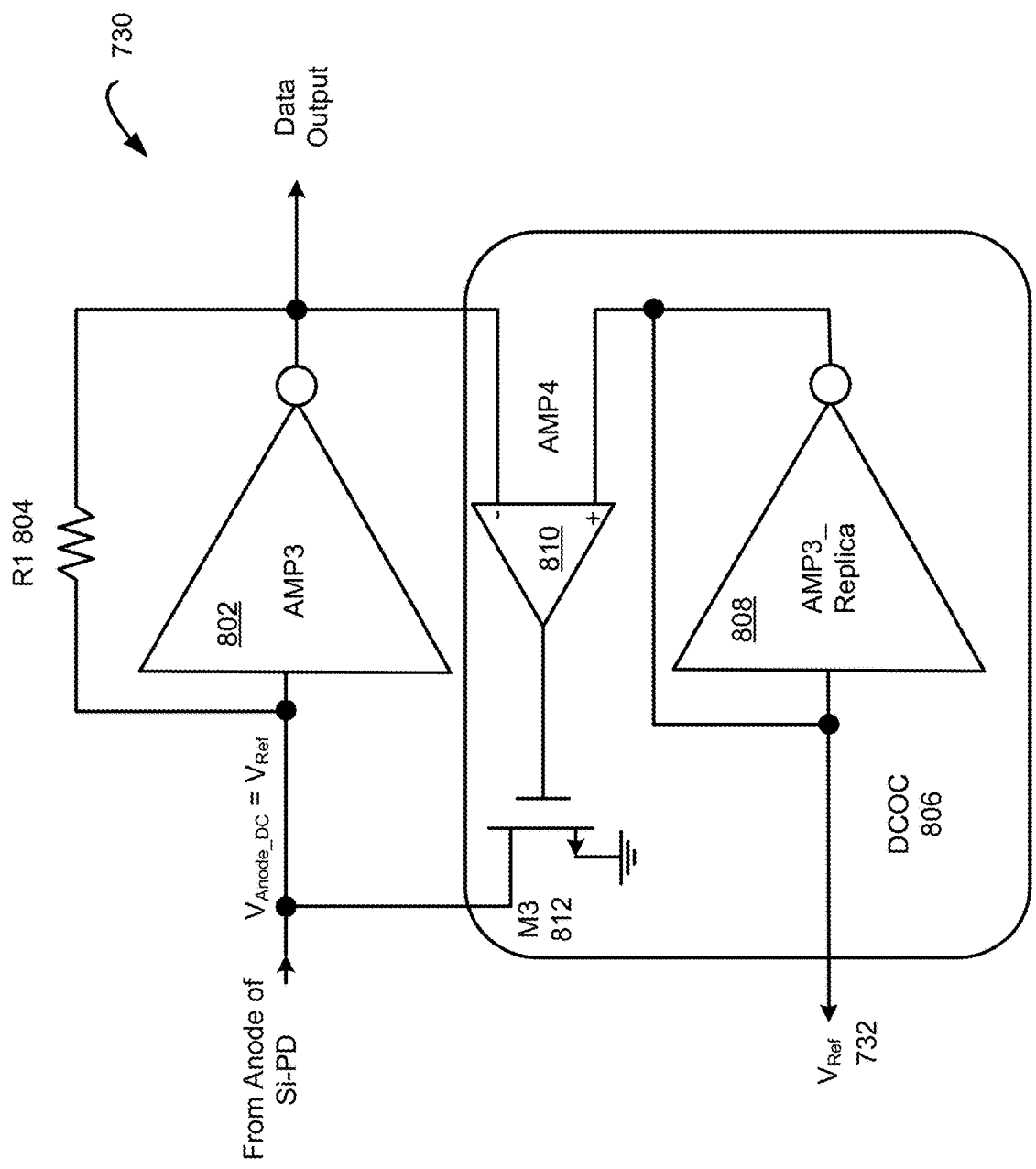
FIG. 8 is an example schematic diagram of another aspect of the photodetector bias circuitry to be used in a photonic apparatus, in accordance with some embodiments.

FIG. 8 is an example schematic diagram of another aspect of the PD bias circuitry to be used in a photonic apparatus, in accordance with some embodiments. More specifically, FIG. 8 illustrates in greater detail an embodiment of the anode bias circuit 112 of FIGS. 1 and 6, which incorporates the TIA array 730 of FIG. 7. For ease of explanation, like components of FIGS. 1, 6, 7, and 8 are indicated by like numerals.

As shown in FIG. 7, the main shunt-feedback TIA array 730 includes a high-speed amplifier core AMP3 802 with a feedback resistor R1 804. A DC-offset-cancellation-loop (DCOC) 806 can be implemented with a self-biased amplifier AMP3_Replica 808, an amplifier AMP4 810, and a transistor M3 812. The DCOC 806 forces the average voltage at TIA array 730 input (e.g., input to the amplifier 802) to be identical with VRef 732. In other words, DCOC 806 forces the average input and output voltages of AMP3 808 to be identical, making the anode voltage equal VRef 732. This is accomplished by feedback elements 810 and 812 which force the DC/average current through R1 804 to be zero by subtracting the average input current from the total input.

Figure 9:
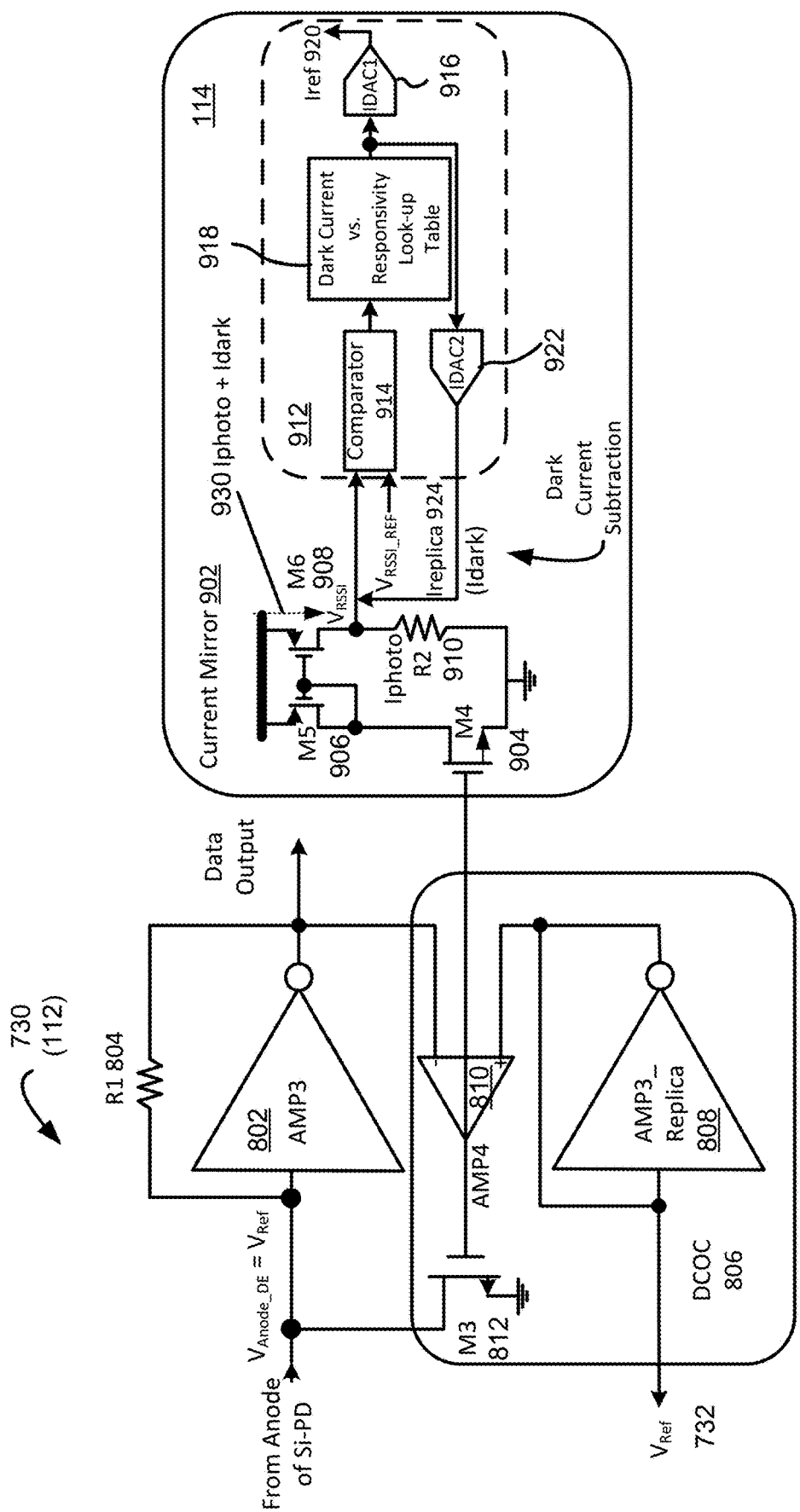
FIG. 9 is an example schematic diagram of yet another aspect of the photodetector bias circuitry to be used in a photonic apparatus, in accordance with some embodiments.

FIG. 9 is an example schematic diagram of yet another aspect of the PD bias circuitry to be used in a photonic apparatus, in accordance with some embodiments. More specifically, FIG. 9 illustrates an embodiment of the anode bias circuit 112 of FIGS. 1, 6, and 8, in combination with the responsivity control circuit 114 of FIG. 1, which is illustrated in FIG. 9 in greater detail. For ease of explanation, like components of FIGS. 1 and 6-9 are indicated by like numerals.

In embodiments, the responsivity control circuit 114 includes a current mirror 902. The current mirror 902 includes transistors M4 904, M5 906, M6 908. The current mirror 902, together with DCOC 806, dark current reference IDAC 922, and resistor 910, can be used to convert the photocurrent from PD 102 into a voltage $V_{RSSI}$. The current mirror 902 output 930 is the current out of M6 908, which includes the dark current and photocurrent Iphoto+Idark. After subtracting the reference dark current Idark from this output, we obtain $V_{RSSI} = I_{Photo} * R2$.

The logic block 912 is configured to compare $V_{RSSI}$ with a reference voltage $V_{RSSI\_REF}$, which is a measure of the desired received signal magnitude (provided to comparator 914). The comparison result is used to generate the dark current reference at the integrated digital-analog converter (IDAC1) 916. The dark current reference Iref 920 generated by IDAC1 916 corresponds to Iref 706 in FIG. 7. The dark current reference Iref 920 can be generated, for example, based on a look-up table 918 of the dark current vs. PD responsivity (as illustrated in FIG. 4). In order to remove the dark current from total PD 102 current (which is a sum of the dark current and photocurrent), a replica current Ireplica 924 generated by the IDAC2 922 based on the table 918 (and equal to Iref 920) can be fed back to the output 930 of the current mirror 902. From the mirror output 930, the known dark current Idark is subtracted through the replica 924, so that only the photocurrent Iphoto flows into R2 910 and results in $V_{RSSI}$. This is compared against the desired value $V_{RSSI\_REF}$ and the dark current reference can be adjusted appropriately. For example, if the received signal is higher than the desired one, the dark current level (and hence the responsivity) can be reduced.

Figure 10:
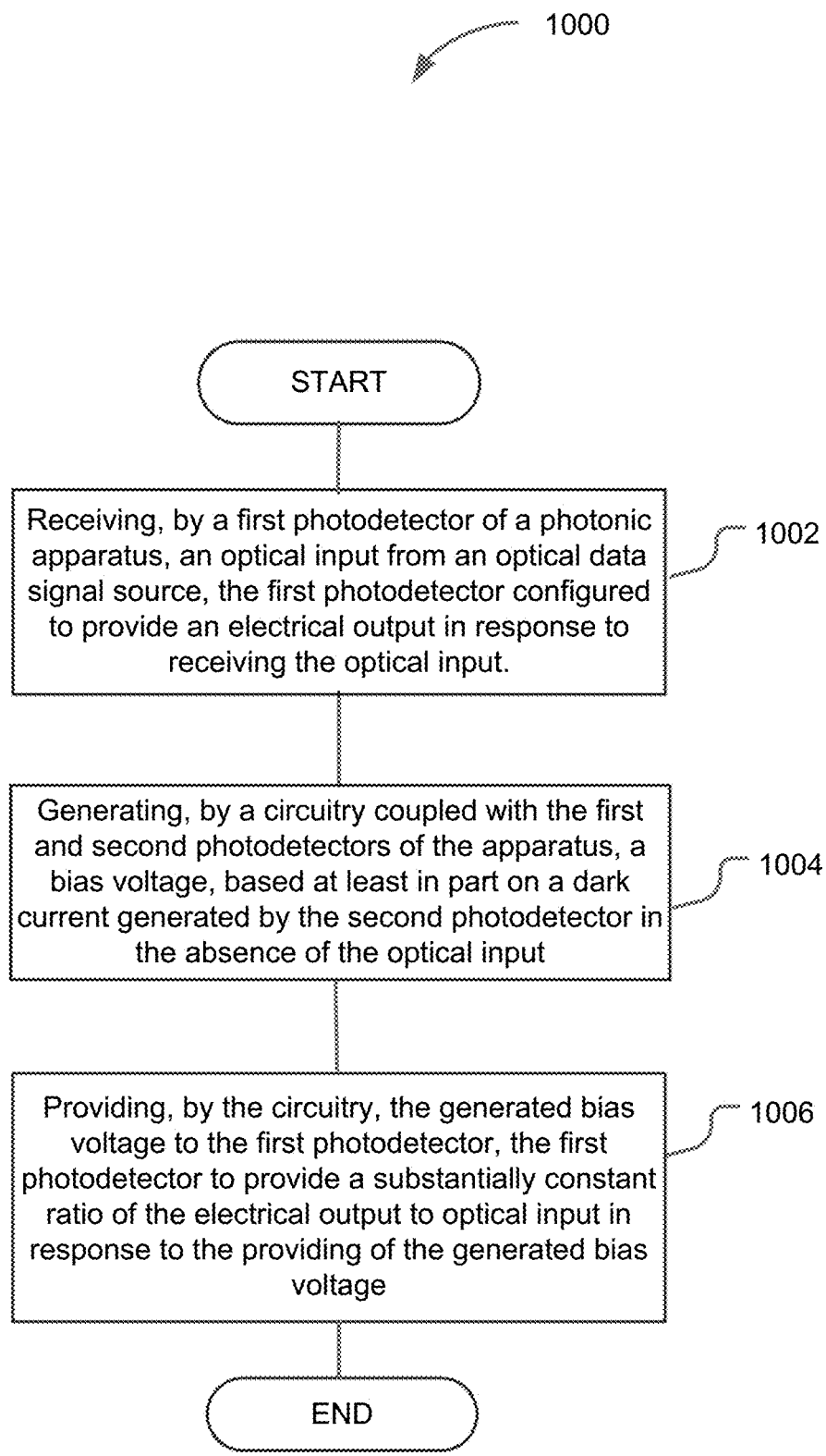
FIG. 10 is an example process flow diagram for providing substantially constant responsivity in a photonic apparatus having a photodetector with bias control, in accordance with some embodiments.

FIG. 10 is an example process flow diagram for providing substantially constant responsivity in a photonic apparatus having a photodetector with bias control, in accordance with some embodiments. The process 1000 may be performed by the apparatus 100 of FIG. 1 using the embodiments described in reference to FIGS. 6-9.

The process 1000 begins at block 1002, and includes receiving, by a first photodetector of the photonic apparatus, an optical input from an optical data signal source. The first photodetector is configured to provide an electrical output in response to receiving the optical input. As discussed in reference to FIGS. 1 and 6-9, the first photodetector (e.g., 102) is coupled with a second photodetector (e.g., 104) of the apparatus (e.g., 100).

At block 1004, the process 1000 includes generating, by a circuitry coupled with the first and second photodetectors of the apparatus, a bias voltage, based at least in part on a dark current generated by the second photodetector in the absence of the optical input.

At block 1006, the process 1000 includes providing, by the circuitry, the generated bias voltage to the first photodetector, wherein the first photodetector is to provide a substantially constant ratio of the electrical output to optical input in response to the provision of the generated bias voltage.

Various operations related to FIG. 10 are described as multiple discrete operations, in a manner that is most helpful in understanding the claimed subject matter. However, the order of description should not be construed as to imply that these operations are necessarily order dependent.

Figure 11:
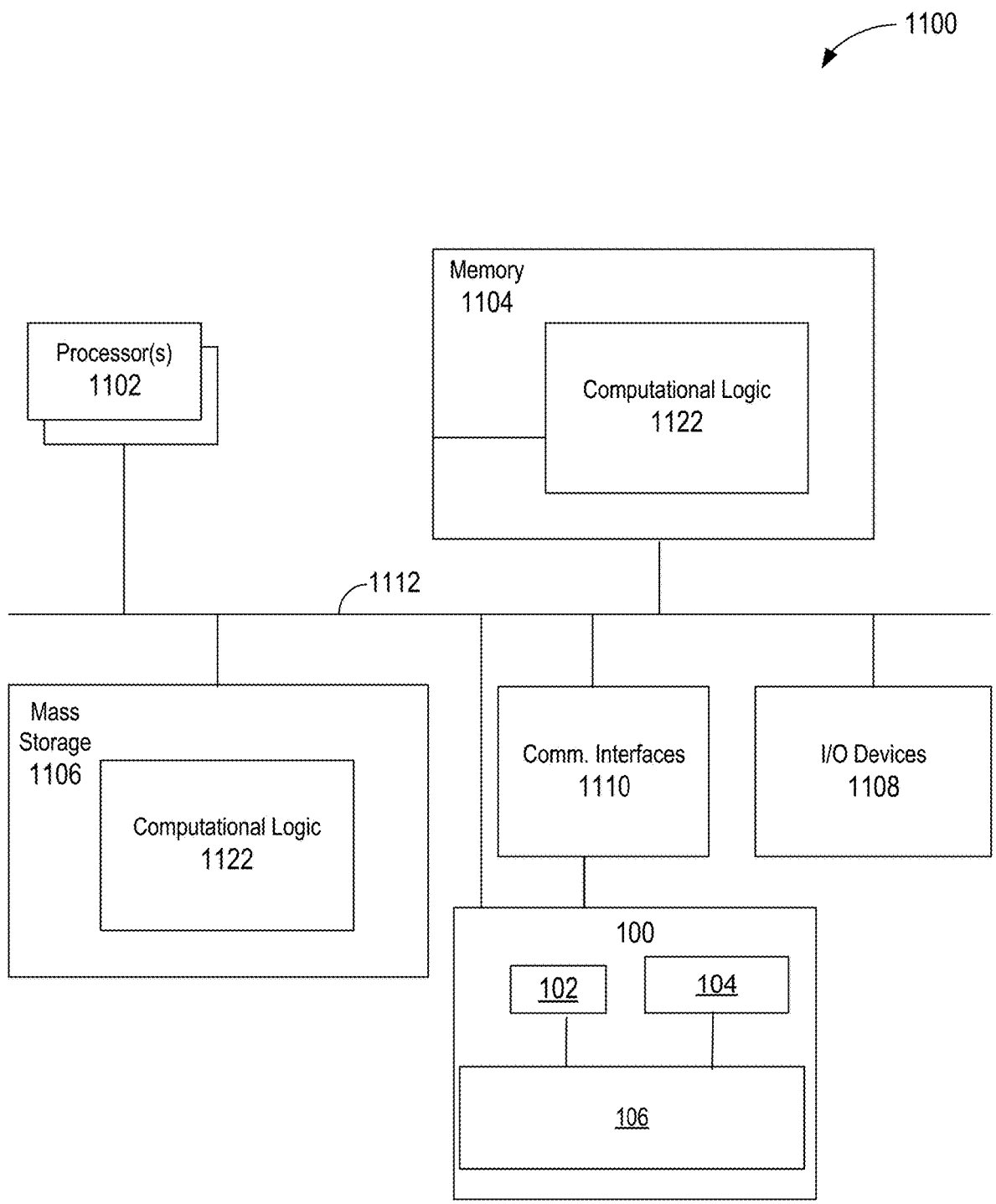
FIG. 11 illustrates an example computing device suitable for use with various components of FIGS. 1 and 6-9, such as photonic apparatus with a photodetector with bias control to provide substantially constant responsivity, in accordance with various embodiments.

FIG. 11 illustrates an example computing device 1100 suitable for use with various components of FIGS. 1 and 6-9, such as photonic apparatus 100 photodetector with bias control to provide substantially constant responsivity, in accordance with various embodiments.

As shown, computing device 1100 may include one or more processors or processor cores 1102 and system memory 1104. For the purpose of this application, including the claims, the terms "processor" and "processor cores" may be considered synonymous, unless the context clearly requires otherwise. The processor 1102 may include any type of processors, such as a central processing unit (CPU), a microprocessor, and the like. The processor 1102 may be implemented as an integrated circuit having multi-cores, e.g., a multi-core microprocessor.

The computing device 1100 may include mass storage devices 1106 (such as diskette, hard drive, volatile memory (e.g., dynamic random-access memory (DRAM), compact disc read-only memory (CD-ROM), digital versatile disk (DVD), and so forth). In general, system memory 1104 and/or mass storage devices 1106 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 1100 may further include input/output (I/O) devices 1108 (such as a display (e.g., a touch-screen display), keyboard, cursor control, remote control, gaming controller, image capture device, and so forth) and communication interfaces 1110 (such as network interface cards, modems, infrared receivers, radio receivers (e.g., Bluetooth), and so forth). In some embodiments, the communication interfaces 1110 may include or otherwise be coupled with the apparatus 100 (e.g., a transceiver) having the PD 102, "dummy" PD 104, and circuitry 106, described herein.

In general, the computing device 1100 may include or otherwise be associated with an optoelectronic system, such as photonic apparatus 100 implementing aspects of the PD 102, "dummy" PD 104, and circuitry 106 as described above. In some embodiments, at least some components of the apparatus 100 may be communicatively coupled with the computing device 1100 and/or be included in one or more of the computing device 1100 components, such as communication interfaces 1110, for example.

The communication interfaces 1110 may include communication chips (not shown) that may be configured to operate the device 1100 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1110 may operate in accordance with other wireless protocols in other embodiments.

The above-described computing device 1100 elements may be coupled to each other via system bus 1112, which may represent one or more buses. In the case of multiple buses, they may be bridged by one or more bus bridges (not shown). Each of these elements may perform its conventional functions known in the art. In particular, system memory 1104 and mass storage devices 1106 may be employed to store a working copy and a permanent copy of the programming instructions for the operation of the transmitter (PD) 102 of FIG. 1. The various elements may be implemented by assembler instructions supported by processor(s) 1102 or high-level languages that may be compiled into such instructions.

The permanent copy of the programming instructions may be placed into mass storage devices 1106 in the factory, or in the field, through, for example, a distribution medium (not shown), such as a compact disc (CD), or through communication interface 1110 (from a distribution server (not shown)). That is, one or more distribution media having an implementation of the agent program may be employed to distribute the agent and to program various computing devices.

The number, capability, and/or capacity of the elements 1108, 1110, 1112 may vary, depending on whether computing device 1100 is used as a stationary computing device, such as a set-top box or desktop computer, or a mobile computing device, such as a tablet computing device, laptop computer, game console, or smartphone. Their constitutions are otherwise known, and accordingly will not be further described.

In embodiments, memory 1104 may include computational logic 1122 configured to practice aspects of embodiments, such as operation of the photonic apparatus 100, as described in reference to FIGS. 1-9. For one embodiment, at least one of processors 1102 may be packaged together with computational logic 1122 configured to practice aspects of optical signal transmission and receipt described herein to form a System in Package (SiP) or a System on Chip (SoC).

In various implementations, the computing device 1100 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1100 may be any other electronic device that processes data.

According to various embodiments, the present disclosure describes a number of examples.

Example 1 is an apparatus comprising: a first photodetector, to receive an optical input and provide a corresponding electrical output; a second photodetector coupled with the first photodetector, wherein the second photodetector is free from receipt of the optical input; and circuitry coupled with the first and second photodetectors, to: generate a bias voltage, based at least in part on a dark current generated by the second photodetector in an absence of the optical input; and provide the generated bias voltage to the first photodetector, wherein the first photodetector is to provide a substantially constant ratio of the electrical output to optical input in response to the provision of the generated bias voltage.

Example 2 includes the apparatus of example 1, wherein the circuitry is to adjust the dark current generated by the second photodetector in the absence of the optical input when the optical input exceeds a power level threshold, and correspondingly adjust the bias voltage based at least in part on the adjusted dark current.

Example 3 included the apparatus of example 2, wherein to correspondingly adjust the bias voltage, the circuitry is to lower the bias voltage.

Example 4 includes the apparatus of c example 1, wherein the first and second photodetectors comprise silicon waveguides.

Example 5 includes the apparatus of example 1, wherein the first and second photodetectors have substantially identical optical and electrical parameters.

Example 6 includes the apparatus of example 1, wherein the circuitry includes a dark current reference source, wherein an anode of the second photodetector is coupled with the dark current reference source, wherein an anode voltage of the second photodetector is based at least in part on a dark current reference provided by the dark current reference source, wherein a cathode bias voltage of the second photodetector is based at least in part on the anode voltage of the second photodetector.

Example 7 includes the apparatus of example 6, wherein the circuitry is to replicate the cathode bias voltage of the second photodetector on the first photodetector, to provide the substantially constant ratio of the electrical output to optical input of the first photodetector.

Example 8 includes the apparatus of example 1, wherein the apparatus comprises a photonic integrated circuit.

Example 9 includes the apparatus of any of examples 1 to 8, wherein the apparatus comprises a transceiver.

Example 10 is a method, comprising: receiving, by a first photodetector of an apparatus, an optical input, wherein the first photodetector is to provide a corresponding electrical output in response to receiving the optical input, and wherein the first photodetector is coupled with a second photodetector of the apparatus; generating, by a circuitry coupled with the first and second photodetectors of the apparatus, a bias voltage, based at least in part on a dark current generated by the second photodetector in an absence of the optical input; and providing, by the circuitry, the generated bias voltage to the first photodetector, wherein the first photodetector is to provide a substantially constant ratio of the electrical output to optical input in response to the providing of the generated bias voltage.

Example 11 includes the method of example 10, further comprising: adjusting, by the circuitry, the dark current generated by the second photodetector in the absence of the optical input when the optical input exceeds a power level threshold; and correspondingly adjusting, by the circuitry, the bias voltage based at least in part on the adjusted dark current.

Example 12 includes the method of example 11, wherein correspondingly adjusting the bias voltage includes lowering, by, the circuitry, the bias voltage.

Example 13 includes the method of example 11, further comprising: generating, by the circuitry, a dark current reference, based at least in part on a table including dark current values and corresponding responsivity values, wherein the responsivity values comprise a ratio of the electrical output to optical input, wherein the adjusting of the dark current includes providing, by the circuitry, the dark current based at least in part on the generated dark current reference.

Example 14 includes the method of any of examples 10 to 13, wherein the apparatus comprises a photonic integrated circuit.

Example 15 includes a computing device, comprising: a processor, to generate data; and a transceiver coupled with the processor, to transmit the generated data, wherein the transceiver includes: a first photodetector, to receive an optical input and provide a corresponding electrical output; a second photodetector coupled with the first photodetector, wherein the second photodetector is free from receipt of the optical input; and circuitry coupled with the first and second photodetectors, to: generate a bias voltage, based at least in part on a dark current generated by the second photodetector in an absence of the optical input; and provide the generated bias voltage to the first photodetector, wherein the first photodetector is to provide a substantially constant ratio of the electrical output to optical input in response to the provision of the generated bias voltage.

Example 16 includes the computing device of example 15, wherein the circuitry is to adjust the dark current generated by the second photodetector in the absence of the optical input when the optical input exceeds a power level threshold, and correspondingly adjust the bias voltage based at least in part on the adjusted dark current.

Example 17 includes the computing device of example 15, wherein the first and second photodetectors comprise silicon waveguides.

Example 18 includes the computing device of example 15, wherein the first and second photodetectors have substantially identical optical and electrical parameters.

Example 19 includes the computing device of example 15, wherein the circuitry includes logic to generate the dark current based at least in part on a look-up table that provides dark current values that correspond to responsivity values of the first photodetector, wherein the responsivity values comprise a substantially constant value.

Example 20 includes the computing device of any of examples 15 to 19, wherein the computing device comprises a server or a data center.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a first photodetector, to receive an optical input and provide a corresponding electrical output;
a second photodetector coupled with the first photodetector, wherein the second photodetector is free from receipt of the optical input; and
circuitry coupled with the first and second photodetectors, to: generate a bias voltage, based at least in part on a dark current generated by the second photodetector in an absence of the optical input; and provide the generated bias voltage to the first photodetector, wherein the first photodetector is to provide a substantially constant ratio of the electrical output to optical input in response to the provision of the generated bias voltage, wherein the circuitry includes a dark current reference source, wherein an anode of the second photodetector is coupled with the dark current reference source, wherein an anode voltage of the second photodetector is based at least in part on a dark current reference provided by the dark current reference source, wherein a cathode bias voltage of the second photodetector is based at least in part on the anode voltage of the second photodetector.

2. The apparatus of claim 1, wherein the circuitry is to adjust the dark current generated by the second photodetector in the absence of the optical input when the optical input exceeds a power level threshold, and correspondingly adjust the bias voltage based at least in part on the adjusted dark current.

3. The apparatus of claim 2, wherein to correspondingly adjust the bias voltage, the circuitry is to lower the bias voltage.

4. The apparatus of claim 1, wherein the first and second photodetectors comprise silicon waveguides.

5. The apparatus of claim 1, wherein the first and second photodetectors have substantially identical optical and electrical parameters.

6. The apparatus of claim 1, wherein the circuitry is to replicate the cathode bias voltage of the second photodetector on the first photodetector, to provide the substantially constant ratio of the electrical output to optical input of the first photodetector.

7. The apparatus of claim 1, wherein the apparatus comprises a photonic integrated circuit.

8. The apparatus of claim 1, wherein the apparatus comprises a transceiver.

9. A method, comprising:
receiving, by a first photodetector of an apparatus, an optical input, wherein the first photodetector is to provide a corresponding electrical output in response to receiving the optical input, and wherein the first photodetector is coupled with a second photodetector of the apparatus;
generating, by a circuitry coupled with the first and second photodetectors of the apparatus, a bias voltage, based at least in part on a dark current generated by the second photodetector in an absence of the optical input;
providing, by the circuitry, the generated bias voltage to the first photodetector, wherein the first photodetector is to provide a substantially constant ratio of the electrical output to optical input in response to the providing of the generated bias voltage;
adjusting, by the circuitry, the dark current generated by the second photodetector in the absence of the optical input when the optical input exceeds a power level threshold;
correspondingly adjusting, by the circuitry, the bias voltage based at least in part on the adjusted dark current; and
generating, by the circuitry, a dark current reference, based at least in part on a table including dark current values and corresponding responsivity values, wherein the responsivity values comprise a ratio of the electrical output to optical input, wherein the adjusting of the dark current includes providing, by the circuitry, the dark current based at least in part on the generated dark current reference.

10. The method of claim 9, wherein correspondingly adjusting the bias voltage includes lowering, by, the circuitry, the bias voltage.

11. The method of claim 9, wherein the apparatus comprises a photonic integrated circuit.

12. A computing device, comprising:
a processor, to generate data; and
a transceiver coupled with the processor, to transmit the generated data, wherein the transceiver includes: a first photodetector, to receive an optical input and provide a corresponding electrical output; a second photodetector coupled with the first photodetector, wherein the second photodetector is free from receipt of the optical input; and circuitry coupled with the first and second photodetectors, to: generate a bias voltage, based at least in part on a dark current generated by the second photodetector in an absence of the optical input; and provide the generated bias voltage to the first photodetector, wherein the first photodetector is to provide a substantially constant ratio of the electrical output to optical input in response to the provision of the generated bias voltage, wherein the circuitry includes logic to generate the dark current based at least in part on a look-up table that provides dark current values that correspond to responsivity values of the first photodetector, wherein the responsivity values comprise a substantially constant value.

13. The computing device of claim 12, wherein the circuitry is to adjust the dark current generated by the second photodetector in the absence of the optical input when the optical input exceeds a power level threshold, and correspondingly adjust the bias voltage based at least in part on the adjusted dark current.

14. The computing device of claim 12, wherein the first and second photodetectors comprise silicon waveguides.

15. The computing device of claim 12, wherein the first and second photodetectors have substantially identical optical and electrical parameters.

16. The computing device of claim 12, wherein the computing device comprises a server or a data center.

* * * * *